(12) United States Patent
Wolter et al.

(10) Patent No.: US 11,169,713 B2
(45) Date of Patent: Nov. 9, 2021

(54) RESTRICTING WRITE CYCLES TO EXTEND THE LIFETIME OF NONVOLATILE MEMORY

(71) Applicant: Landis+Gyr Innovations, Inc., Alpharetta, GA (US)

(72) Inventors: Chad Wolter, Pequot Lakes, MN (US); Ian Davis, Peakhurst Heights (AU); August Schack, Brainerd, MN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 102 days.

(21) Appl. No.: 16/592,196

(22) Filed: Oct. 3, 2019

(65) Prior Publication Data
US 2021/0103391 A1   Apr. 8, 2021

(51) Int. Cl.
*G06F 12/00*   (2006.01)
*G06F 3/06*    (2006.01)
*G06F 9/52*    (2006.01)
*G06F 11/07*   (2006.01)

(52) U.S. Cl.
CPC .......... *G06F 3/0616* (2013.01); *G06F 3/0653* (2013.01); *G06F 3/0679* (2013.01); *G06F 9/52* (2013.01); *G06F 11/076* (2013.01); *G06F 11/0793* (2013.01)

(58) Field of Classification Search
CPC .. G06F 3/0616; G06F 3/0653; G06F 11/0793; G06F 9/52; G06F 3/0679; G06F 11/076
USPC .......................................................... 711/154
See application file for complete search history.

(56) References Cited

U.S. PATENT DOCUMENTS

| | | | |
|---|---|---|---|
| 6,938,254 B1 | 8/2005 | Mathur et al. | |
| 10,079,806 B2* | 9/2018 | Adams | .................... H04L 63/08 |
| 10,462,134 B2* | 10/2019 | Isola | ................... H04L 63/0876 |
| 2013/0073820 A1* | 3/2013 | Watanabe | ............... G06F 3/065 |
| | | | 711/162 |
| 2013/0326168 A1 | 12/2013 | Chang et al. | |
| 2015/0347038 A1* | 12/2015 | Monteleone | .......... G06F 3/0679 |
| | | | 711/103 |
| 2018/0278624 A1* | 9/2018 | Kuperman | ............ G06F 21/602 |

(Continued)

OTHER PUBLICATIONS

International Patent Application No. PCT/US2020/053211, International Search Report and Written Opinion, dated Dec. 16, 2020, 9 pages.

*Primary Examiner* — Mardochee Chery
(74) *Attorney, Agent, or Firm* — Kilpatrick Townsend & Stockton LLP

(57) ABSTRACT

A method for restricting write cycles to a storage device includes tracking a first count of a first set of writes to memory executed by a first subsystem of a computing device and, further, determining that the first count meets a write threshold of the first subsystem. The method includes determining that blocking criteria are met by the first subsystem based on the first count exceeding the write threshold of the first subsystem and, further, determining that blocking criteria are not met by a second subsystem of the computing device. The method includes blocking the first set of writes from being synchronized to the storage device, based on the blocking criteria being met by the first subsystem, and synchronizing memory contents of the second subsystem to the storage device, based on the blocking criteria not being met by the second subsystem.

20 Claims, 4 Drawing Sheets

(56) References Cited

U.S. PATENT DOCUMENTS

2019/0258424 A1* 8/2019 Rinaldi ................ G06F 3/0689
2020/0104482 A1* 4/2020 Swanson ............... G06F 21/561

* cited by examiner

RESTRICTING WRITE CYCLES TO EXTEND THE LIFETIME OF NONVOLATILE MEMORY

TECHNICAL FIELD

Various implementations of the invention relate to nonvolatile memory and, more particularly, to restricting write cycles to extend the lifetime of nonvolatile memory.

BACKGROUND

Flash storage is a form of nonvolatile computer memory that can be electrically written and erased. Flash storage has various benefits over other forms of nonvolatile memory. For instance, flash storage can be more economical and reliable and has lower power-consumption requirements. Currently, flash storage is used extensively in devices such as smartphones, memory sticks, digital audio players, and scientific instruments.

SUMMARY

In one implementation, a method for restricting write cycles to a storage device includes tracking a first count of a first set of writes to memory executed by a first subsystem of a computing device and, further, determining that the first count meets a write threshold of the first subsystem. The method includes determining that blocking criteria are met by the first subsystem based on the first count exceeding the write threshold of the first subsystem and, further, determining that blocking criteria are not met by a second subsystem of the computing device. The method includes blocking the first set of writes from being synchronized to the storage device, based on the blocking criteria being met by the first subsystem, and synchronizing memory contents of the second subsystem to the storage device, based on the blocking criteria not being met by the second subsystem.

In another implementation, a computer-program product for restricting write cycles to a storage device includes a computer-readable storage medium having program instructions embodied thereon. The program instructions are executable by a processor to cause the processor to perform a method. The method includes tracking a first count of a first set of writes to memory executed by a first subsystem of a computing device and, further, determining that the first count meets a write threshold of the first subsystem. The method includes determining that blocking criteria are met by the first subsystem based on the first count exceeding the write threshold of the first subsystem and, further, determining that blocking criteria are not met by a second subsystem of the computing device. The method includes blocking the first set of writes from being synchronized to the storage device, based on the blocking criteria being met by the first subsystem, and synchronizing memory contents of the second subsystem to the storage device, based on the blocking criteria not being met by the second subsystem.

In yet another implementation, a computing device includes a processor and a memory. The processor is configured to execute computer-readable instructions, and the memory is configured to store the computer-readable instructions that, when executed by the processor, cause the processor to perform operations. The operations include tracking a first count of a first set of writes to memory executed by a first subsystem of a computing device and, further, determining that the first count meets a write threshold of the first subsystem. The operations include determining that blocking criteria are met by the first subsystem based on the first count exceeding the write threshold of the first subsystem and, further, determining that blocking criteria are not met by a second subsystem of the computing device. The operations include blocking the first set of writes from being synchronized to the storage device, based on the blocking criteria being met by the first subsystem, and synchronizing memory contents of the second subsystem to the storage device, based on the blocking criteria not being met by the second subsystem.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
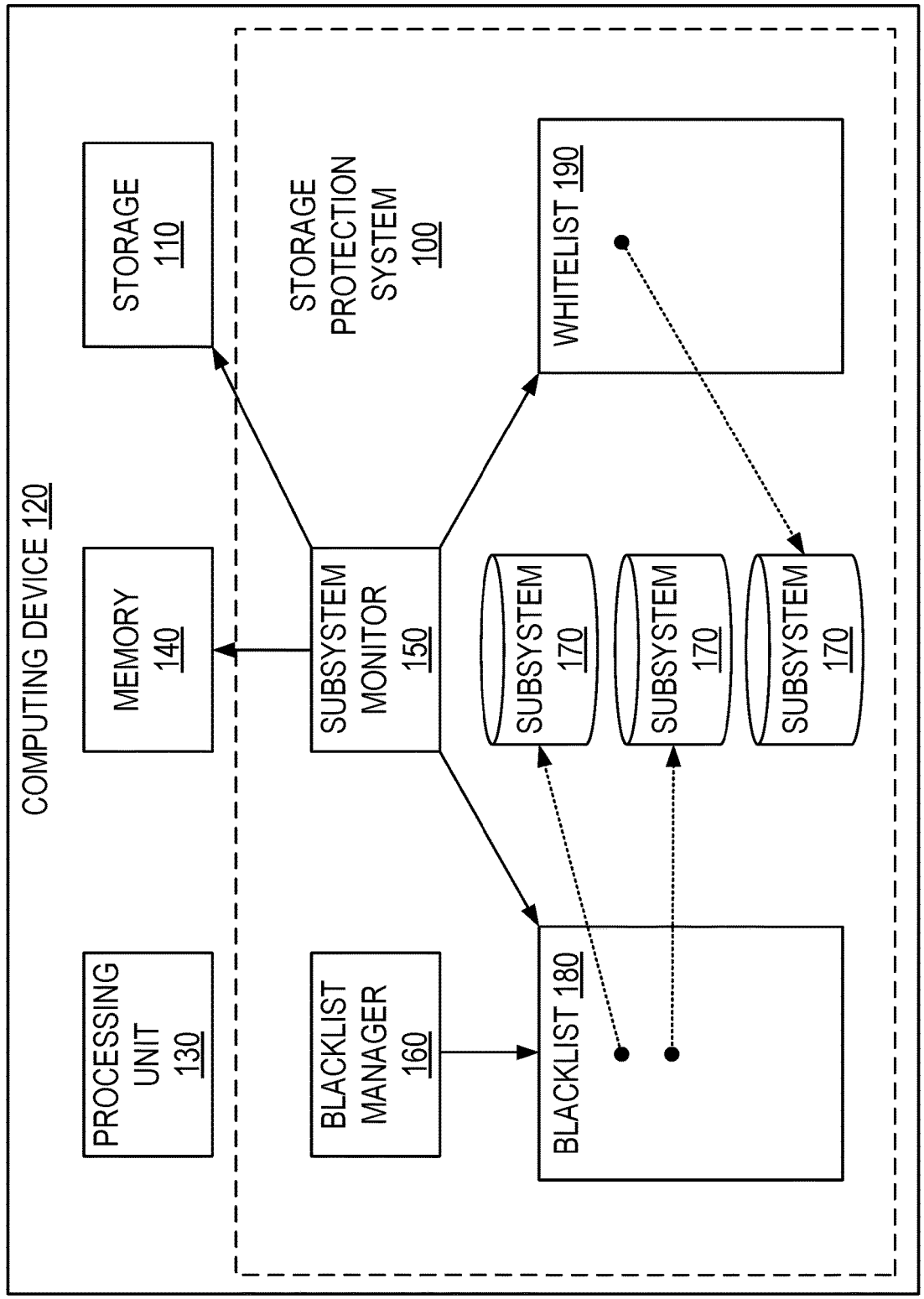
FIG. 1 is a conceptual diagram of a storage protection system for protecting the lifespan of a storage device, according to certain implementations of an invention described herein.

Devices utilizing a flash storage technology, such as NAND and embedded Multimedia Controller (eMMC), have a limited lifespan that is a function of the cumulative number of write and erase operations (i.e., write cycles) performed. As write cycles are performed, flash storage ages, and the data written to the flash storage becomes corrupt. Specifically, the retention period (i.e., how long data written to memory remains valid) drops as the number of write cycles becomes high. Eventually, as numerous write cycles occur to a block of the flash storage, that block may become useless due to a dramatically reduced retention. This aging effect due to write cycles is irreversible. The various applications of a device typically share nonvolatile memory on the device. As a result, if an application is malfunctioning or malicious in such a way that the application performs numerous write cycles, the result can be a failure of the nonvolatile memory, which impacts other applications on the device. Thus, the reduction in retention caused by numerous write cycles is a hardware fault that can be caused by software behavior.

The impact of write cycles on the retention period of flash storage has made the use of flash storage infeasible for integration in devices intended for long-term use. Devices with short life cycles, such as flash drives and smartphones, often use flash storage, but products intended for a lifespan of many years typically use some other storage technique, such as magnetic storage devices. As a result, the benefits of flash storage are not incorporated into such devices, leading toward these devices being more costly to manufacture or less reliable or having greater power requirements.

In implementations described herein, a storage protection system tracks the number of attempted writes, which may include both completed writes as well as writes that are blocked as described herein. If the attempted writes for a subsystem meet (e.g., equal or exceed) a write threshold deemed to represent an excess, the storage protection system may take steps to remediate this excess. For instance, the storage protection system may suspend or kill the subsystem, or the storage protection system may restart the entire device. Thus, implementations described herein restrict the write cycles of a subsystem to an associated write threshold. Further, in some implementations, the storage protection system maintains a whitelist and a blacklist. Subsystems on the whitelist may be exempt from having their write cycles restricted, while subsystems on the blacklist may be subject to more severe penalties due to having a history of meeting their respective write thresholds. As such, the lifespan of a storage device may be protected by limiting the write cycles that occur.

The various write thresholds of the subsystems of the device may be selected based on a desired lifespan of the device. By requiring the subsystems to comply with such write thresholds or to risk remediation, the storage protection system may thus restrict the write cycles occurring on a storage device. Because the storage device's lifespan is based on the number of write cycles, the storage protection system may thus ensure that the lifespan is as expected. As a result, manufacturers of devices can utilize flash storage without concern that the lifespan of such devices will be negatively impacted by unpredictable write cycles, and such manufacturers can also provide a more accurate lifespan of such a device when preparing device specifications, because implementations described herein can ensure that the device operates within expected parameters with respect to write cycles.

FIG. 1 is a conceptual diagram of a storage protection system 100 for protecting the lifespan of a storage device 110, according to certain implementations of an invention described herein. As shown in FIG. 1, the storage protection system 100 may be integrated into a computing device 120, such as a desktop computer, notebook computer, utility meter, or other computing device 120 utilizing flash storage.

The computing device 120 may include a processing unit 130, a memory 140, and a storage device 110, also referred to herein as a storage 110. The processing unit 130 may be configured to execute program code stored in the memory 140 or the storage 110. For instance, the processing unit 130 may be a microprocessor, or the processing unit 130 may be a microcontroller into which the memory 140 or the storage 110, or both, are integrated. The memory 140 may be a form of volatile memory, such as random-access memory (RAM), configured to store data and to store program code to be executed by the processing unit 130. The storage 110 may be nonvolatile memory configured to store data and program code. For instance, the storage 110 is a form of flash storage, such as NAND or eMMC.

In some implementations, the storage protection system 100 includes a subsystem monitor 150 and a blacklist manager 160, each of which may run on the computing device 120 or may be in communication with the computing device 120. The subsystem monitor 150 may utilize a set of write thresholds, each write threshold associated with a corresponding subsystem 170 of the computing device 120. Specifically, each write threshold may indicate how many write cycles are allowed to be performed by the corresponding subsystem 170 within an interval of time (e.g., an hour). Based on the write attempts performed by a subsystem 170 during an interval as compared to the respective write threshold, the subsystem monitor 150 may block write attempts, blacklist subsystems 170, or perform other remedial actions. The blacklist manager 160 may manage subsystems 170 on the blacklist 180 and may perform remedial actions on those subsystems 170 or may release those subsystems 170 from the blacklist 180 as needed.

A subsystem 170 can be, for instance, an application package installed on the computing device 120, an operating system, or a set of one or more processes working toward a common task. A subsystem 170 may include one or more associated processes and may perform writes through those processes associated with the subsystem 170. In some implementations, a designer of the computing device 120 (e.g., a manufacturer or a service provider) defines the subsystems 170; for instance, the designer defines which processes together form a subsystem 170. The designer may further decide a corresponding write threshold for each subsystem 170. In some implementations, a subsystem 170 that commits an infraction (e.g., exceeding its respective write threshold) risks remedial action, such as suspension, being killed, or denial of write access.

To select the write thresholds for the various subsystems 170 of a computing device 120, the designer may determine a desired lifespan for the computing system. Based on the endurance of the storage 110 (i.e., the number of write cycles until a memory block becomes unusable) and the desired lifespan, the designer may determine a total number of write cycles per interval (e.g., per day) to achieve that lifespan, such that the computing device 120 would remain useable for the desired lifespan. The designer may allot the number of write cycles per interval to the various subsystems 170 initially installed on the computing device 120, such that each such allotment becomes a write threshold or is the basis of a write threshold. It need not be the case that each subsystem 170 is allotted the same number of write cycles per interval. Rather, for instance, the allotments may be based on expected usage, such that a subsystem expected to perform more writes during standard usage may be allocated a greater portion of the write cycles per interval as compared to a subsystem expected to perform fewer writes during standard usage.

In some implementations, the various write thresholds may be stored in the computing device 120, for instance, in a dedicated partition of the storage 110. Further, in some implementations, a write threshold is dynamic. For instance, when a new subsystem 170 is added to the computing device 120 or when critical processes not subject to write thresholds perform more writes than expected, the various write thresholds of the computing device 120 may be adjusted downward to accommodate the additional writes that have occurred or are expected to occur. For example, when a new subsystem 170 is added to the computing device, for instance, when a third-party application is installed, the write thresholds of the other subsystems 170 may be adjusted downward to accommodate the addition of a new write threshold for the new subsystem 170. Specifically, in some implementations, the new write threshold may be equal to, or otherwise based on, the quantity of writes subtracted from the write thresholds of other subsystems 170. When a write threshold is adjusted, the stored value of the write threshold may be adjusted to a new value. Through the use of dynamic write thresholds, the lifespan of the storage 110 can be protected even as subsystems 170 change in the computing device 120.

In some implementations, the storage protection system 100 utilizes a whitelist 190, a blacklist 180, or both. The whitelist 190 may include subsystems 170 that are favored, and the blacklist 180 may include subsystems 170 that are disfavored, as described further below. In some implementations, as shown in FIG. 1, the blacklist 180 is implemented as a set of references to subsystems 170 that have been blacklisted, and the whitelist 190 is implemented as a set of references to subsystems 170 that have been whitelisted.

The whitelist 190 may include subsystems 170 that are allowed to freely operate without write thresholds, or with write thresholds set so high as to be effectively nonexistent. In some implementations, subsystems 170 are added to the whitelist 190 at design time, and addition to the whitelist 190 is permanent. Further, in some implementations, the whitelist 190 can be manually modified by an administrator of the computing device 120. Whitelisted subsystems 170 may include, for instance, processes of the storage protection system 100 itself, critical processes, trusted processes, processes expected to generate write activity in bursts, or processes utilized for debugging.

The blacklist 180 may include subsystems that have committed infractions in the form of meeting their write thresholds one or more times. As a result of having committed an infraction, and as a result of being on the blacklist 180, a subsystem 170 may face penalties or stricter requirements from the storage protection system 100. For instance, a blacklisted subsystem 170 may be blocked from writing to the storage 110 or may be subject to other remediation as described below.

The blacklist 180 and the whitelist 190 may be implemented in various ways. For instance, for each of the blacklist 180 and the whitelist 190, the storage protection system 100 may maintain a data structure representing a list. Additionally or alternatively, each subsystem 170 may be associated with a status indicating whether the subsystem 170 is blacklisted, whitelisted, or neither. For instance, the storage protection system 100 may maintain a table or other data structure mapping each subsystem 170 to its associated status, or each subsystem 170 may be represented by a data structure that includes or is associated with a variable representing the respective status. In such implementations, determining whether a subsystem 170 is on the blacklist 180 or on the whitelist 190, or neither, may include determining the status associated with the subsystem 170.

In some implementations, if the status of a subsystem 170 is blacklisted, then the subsystem 170 may be deemed to be on the blacklist 180. Similarly, if a subsystem 170 is on the blacklist 180, then the subsystem 170 may be deemed to have a status of blacklisted. Further, a subsystem 170 may be deemed added to the blacklist 180 when the subsystem's status is changed to blacklisted, and the subsystem 170 may be deemed removed from the blacklist 180 when the subsystem's status is changed from blacklisted to some other status (e.g., non-blacklisted). Similarly, a subsystem's status may be deemed to change to blacklisted when the subsystem 170 is added the blacklist 180, and the subsystem's status may be deemed changed to some other status (e.g., non-blacklisted) when the subsystem 170 is removed from the blacklist 180. Analogously, if the status of a subsystem 170 has a whitelisted status, then the subsystem 170 may be deemed to be on the whitelist 190, and when a subsystem 170 is on the whitelist 190, that subsystem 170 may be deemed to have a status of whitelisted.

As described above, various remedial actions may be taken against a subsystem 170 on the blacklist 180. However, in some implementations, before such a remedial action is taken, the storage protection system 100 must identify which subsystems 170 are committing infractions. In some implementations, the subsystem monitor 150 is configured to monitor attempted writes, to block write access to the storage 110 for subsystems 170 that commit infractions, and to blacklist subsystems 170 that commit infractions.

The subsystem monitor 150 may be implemented as hardware, software, or a combination of both. For instance, the subsystem monitor 150 may be implemented as program code executed by the processing unit 130, or the subsystem monitor 150 may be implemented as a specialized hardware device. In some implementations, the subsystem monitor 150 has trusted status and is thus able to monitor writes to the memory 140, to block writes to the storage 110 (e.g., by blocking direct writes to storage 110 or by blocking synchronization of memory contents to storage 110), or to allow writes to storage 110 (e.g., by allowing direct writes to storage or by allowing synchronization of memory contents to storage 110).

In one implementation, the subsystem monitor 150 includes, or has access to, a driver for the memory 140. Thus when a subsystem 170 writes to memory 140, the subsystem monitor 150 tracks the write, allows the write to be saved to memory 140 as memory contents, and determines whether those memory contents are synchronized to storage 110. Typically, a process writes data to the memory 140, and that data is synchronized (i.e., written) to the storage 110 in normal operation of the computing device 120. In some implementations, however, the subsystem monitor 150 interrupts the synching between the memory 140 and the storage 110, thus controlling whether writing to storage actually occurs. The subsystem monitor 150 may initiate synchronizing the memory 140 to storage 110 when certain conditions are met, such as when a subsystem 170 has not met its write threshold, as described in this disclosure. In another implementation, each subsystem 170 utilizes an application programming interface (API) to write data, and the library implementing the API calls the subsystem monitor 150 when a write operation is performed. As described above, the subsystem monitor 150 allows the write to modify the memory 140 but may prevent direct writes to the storage 110 and may prevent synchronization of the memory 140 to the storage 110. The subsystem monitor 150 may initiate synchronization the memory 140 to storage 110 or may allow a direct write to the storage 110 when write conditions are met, such as when a subsystem 170 has not met its write threshold.

Periodically, the subsystem monitor 150 may determine write statistics describing how the various subsystems 170 of the computing device 120 have written to the memory 140. Additionally or alternatively, in some implementations, the subsystem monitor 150 updates the write statistics continuously, such as each time a write is attempted. Based on these write statistics, the subsystem monitor 150 may determine which subsystems 170 have committed infractions. The subsystem monitor 150 may block such a subsystem 170 from writing to the storage 110, such that memory contents written to the memory 140 by that subsystem 170 are not synchronized to the storage 110. Additionally or alternatively, the subsystem monitor 150 may add such a subsystem 170 to the blacklist 180. Further, in some implementations, the subsystem monitor 150 may report the write statistics to a centralized location, such as a headend system, where write statistics of various computing devices 120 may be aggregated together or compared, such as for debugging or reporting purposes.

The subsystem monitor 150 may be configured to initiate various remedial actions when a subsystem 170 commits an infraction (e.g., meets its write threshold). The remedial actions may include, for instance, adding the subsystem 170 to the blacklist 180 and preventing write access to the storage 110 while the subsystem 170 is on the blacklist 180, logging the infraction, allowing an excess of the write threshold on a one-time or limited-term basis, temporarily suspending processes associated with the subsystem 170, terminating processes associated with the subsystem 170, resetting or restarting the computing device 120 as a whole, or terminating various subsystems 170 in the computing device 120 with the exception of critical processes (i.e., entering a safe mode). Each of these remedial actions have respective benefits. At each infraction of a subsystem 170, the subsystem monitor 150 may initiate one or more remedial actions. In some implementations, each subsystem 170 is associated with a predetermined set of remedial actions, and when the subsystem 170 commits an infraction, the subsystem monitor 150 may initiate each remedial action in that predetermined set responsive to the infraction.

The remedial action of preventing write access to the storage 110 may directly prevent a subsystem 170 from exceeding its write threshold, or from exceeding its write threshold to a predefined degree. As a result of preventing writes to storage 110 when a write threshold is met, the storage protection system 100 may protect the lifespan of the storage 110 by controlling the total write cycles that occur.

The remedial action of logging the infraction enables the storage protection system 100 or a remote system, such as a headend system, to track the history of writes. As such, the protection system 100, the headend system, or some other system or entity is able to identify whether the computing device 120 is behaving anomalously or is able to identify anomalous subsystems 170.

The remedial action of allowing the write threshold to be met on a one-time or limited-term basis may enable a subsystem 170 some degree of leeway with respect to the respective write threshold. For instance, in the case of a subsystem 170 that experiences a burst of writes on a one-time or infrequent basis, it may be the case that such bursts are not likely to impact the lifespan of the storage 110. However, in this case, the occurrence of meeting the write threshold may be logged, so as to prevent writes from the subsystem 170 in the future for a period of time (e.g., while the subsystem 170 is on the blacklist 180).

The remedial action of temporarily suspending the subsystem (e.g., suspending processes associated with the subsystem 170) delays the subsystem 170 from completing a write until the subsystem 170 is resumed. The write rate of the subsystem 170 may thus be effectively reduced based on a function of the suspension duration (i.e., the time between suspension and resumption of the subsystem 170). In some embodiments, the suspension duration is selected to enable the write rate of the subsystem 170 to be reduced to an acceptable level below the write threshold. Further, suspension and resumption of the subsystem 170 may allow for minimal disruption to the logic within the subsystem 170. In subsystems 170 insensitive to timing, no special handling of suspension and resumption operations may be required and functionality may continue as normal except at a slower rate.

The remedial action of terminating the subsystem (e.g., terminating processes associated with the subsystem 170) may stop the subsystem 170 from trying to write, at least for the time it takes for the subsystem 170 to restart. Further, the restart of the subsystem 170 may correct a malfunction that was causing the subsystem 170 to perform excessive write attempts.

The remedial action of terminating various subsystems 170 in the computing device 120 with the exception of critical processes, thus causing the computing device 120 to enter safe mode, may stop such subsystems 170 from performing excessive writes. In some cases, subsystems 170 will interact with one another, and thus, the excessive rights of one subsystem 170 may be caused by the interaction with another subsystem 170. Going into safe mode may allow the continuation of critical processes, such as network communication and, if the computing device 120 is a utility meter, measuring consumption of a resource. Thus, the computing device 120 may continue performing its critical functions and may still be able to communicate with an external resource, such as a headend system, for debugging, software update, or consumption-reporting purposes.

The remedial action of resetting or restarting the computing device 120 as a whole has the same benefits as going into safe mode but is potentially a more drastic solution because critical processes would be temporarily shut down during the restart or reset. This more drastic action may be useful in some cases, particularly if subsystem 170 whose infraction prompted the remedial action is a critical process or is a subsystem 170 that interacts with critical processes.

In some implementations, the blacklist manager 160 may manage subsystems 170 on the blacklist 180. For instance, each subsystem 170 may be associated with at least one timer, such as a release timer, a remediation timer, or both. Each such timer may be initialized (e.g., reset) when the associated subsystem 170 is added to the blacklist 180. The blacklist manager 160 may manage timers associated with blacklisted subsystems 170 and may perform actions on the blacklisted subsystems 170 at the expiration of such timers.

If associated with a subsystem 170 that has been blacklisted, a release timer may count out a release time, after which the blacklist manager 160 may release (i.e., remove) the subsystem 170 from the blacklist 180. Thus, the blacklist manager 160 may utilize the release timer to ensure that the associated subsystem 170 is only temporarily blacklisted due to an infraction. In some implementations, if a subsystem 170 that is currently blacklisted commits another infraction, the blacklist manager 160 may reset the release timer, such that a subsystem's release does not occur until the release time has passed after the most recent infraction by the subsystem 170. In this manner, the release time may act as a threshold time, after which the subsystem 170 is removed from the blacklist 180.

If associated with a subsystem 170 that has been blacklisted, a remediation timer counts out a remediation time, after which the blacklist manager 160 may perform at least a portion of a remedial action, such as initiating a remedial action or concluding a remedial action previously initiated by the subsystem monitor 150. In one example, the subsystem monitor 150 suspends a subsystem 170 upon adding that subsystem 170 to the blacklist 180. In that case, the remediation timer may be used to count out a remediation time equal to a desired suspension duration, at the expiration of which the blacklist manager 160 may resume the subsystem 170. In another example, when a subsystem 170 has been blacklisted, the blacklist manager 160 may kill the subsystem 170 (e.g., by killing some or all processes of the subsystem 170) after the remediation time has expired. In this way, the storage protection system 100 can allow the subsystem 170 to prepare for its own shutdown during the remediation time, such as by performing pre-shutdown tasks or by shutting itself down. In another example, the blacklist manager 160 may restart the computing device 120 as a whole, or may reset the operating system on the computing device 120, after the remediation time has expired. Thus, the use of the remediation timer may enable the various subsystems 170 of the computing device 120 to prepare for shutdown. In this manner, the remediation time may act as a threshold time, after which some remedial action may be performed or concluded.

A timer may be implemented in various ways. For instance, a timer may be implemented as a countdown timer. For instance, when a subsystem 170 is placed on the blacklist 180 or commits an infraction while already on the blacklist 180, an associated release timer implemented as a countdown timer may be initialized with a value representing a release time and may count downward as time passes. When the release timer reaches zero, the release timer and the associated release time may be deemed expired, and the blacklist manager 160 may remove the subsystem 170 from the blacklist 180 responsive to such expiration. For another example, when a subsystem 170 is placed on the blacklist 180, an associated remediation timer implemented as a countdown timer may be initialized with a value representing a remediation time and may count downward as time passes. When the remediation timer reaches zero, the remediation timer and the associated remediation time may be deemed expired, and responsive to the expiration, the blacklist manager 160 may perform a remedial action (e.g., terminating the subsystem 170 or restarting the computing device 120) or may conclude a remedial action (e.g., resuming the subsystem 170 after a suspension).

In some implementations, however, a timer may count upward. In one example of this, when a subsystem 170 is placed on the blacklist 180 or commits an infraction while already on the blacklist 180, an associated release timer implemented as an upward-counting timer may be initialized with a value of zero and may count upward toward a release time as time passes. When the release timer reaches the release time, the release timer and the associated release time may be deemed expired, and the blacklist manager 160 may remove the subsystem 170 from the blacklist 180 responsive to such expiration. For another example, when a subsystem 170 is placed on the blacklist 180, an associated remediation timer implemented as an upward-counting timer may be initialized with a value of zero and may count upward to a remediation time as time passes. When the remediation timer reaches the remediation time, the remediation timer and the remediation time may be deemed expired, and responsive to the expiration, the blacklist manager 160 may perform or conclude a remedial action.

Each timer may count time based on an established unit of time associated with that timer. For example, a timer may represent time in seconds and may count downward or upward in seconds. For another example, a timer may represent time in terms of intervals, and in that case, the timer may count downward or upward according to the passage of intervals. It will be understood that various units of time measurement may be used by the timers.

Figure 2:
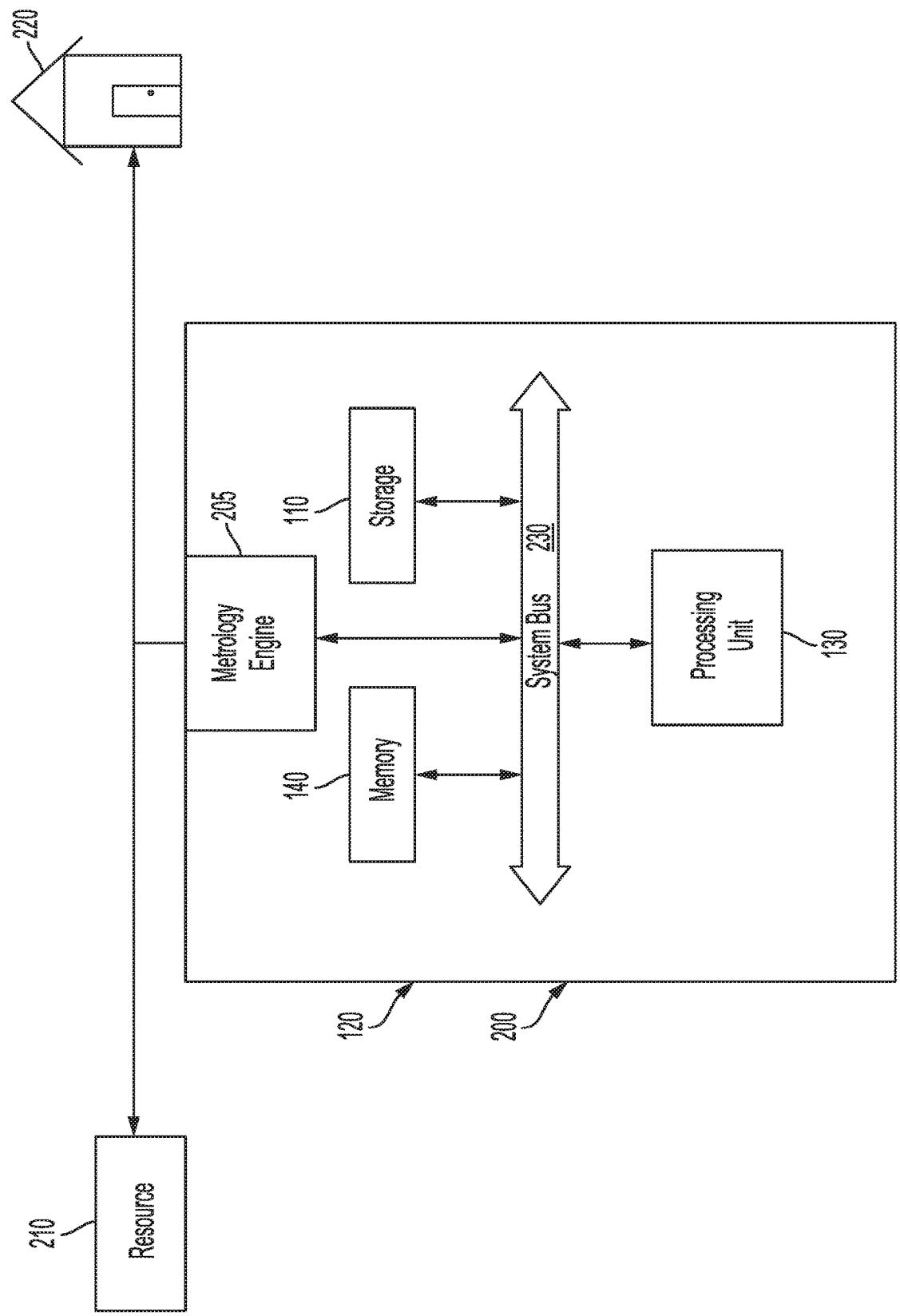
FIG. 2 is an architectural diagram of a computing device, specifically a utility meter, on which the storage protection system can run, according to certain implementations of the invention.

FIG. 2 is an architectural diagram of a computing device 120, specifically a utility meter 200, on which the storage protection system 100 can run, according to certain implementations of the invention. For example, and not by way of limitation, the utility meter 200 may be a water meter, a gas meter, or another type of meter that measures consumption of a resource 210 on a premises 220. To this end, the utility meter 200 may include a metrology engine 205, which detects a signal indicating use of the resource 210 and, based on that signal, determines use of the resource 210 on the premises 220. As with other types of computing devices 120, the utility meter 200 may include a processing unit 130, a memory 140, and a storage 110, which may be connected to one another through a system bus 230. For example, and not by way of limitation, the memory 140 may be RAM, and the storage 110 may be flash storage, such as NAND memory or eMMC. Although a utility meter 200 is shown in FIG. 2, it will be understood that computing device 120 is not limited to a utility meter 200. Rather, for instance, the computing device 120 may be a collector, a gateway, or another computing device other than a utility meter 200.

Figure 3:
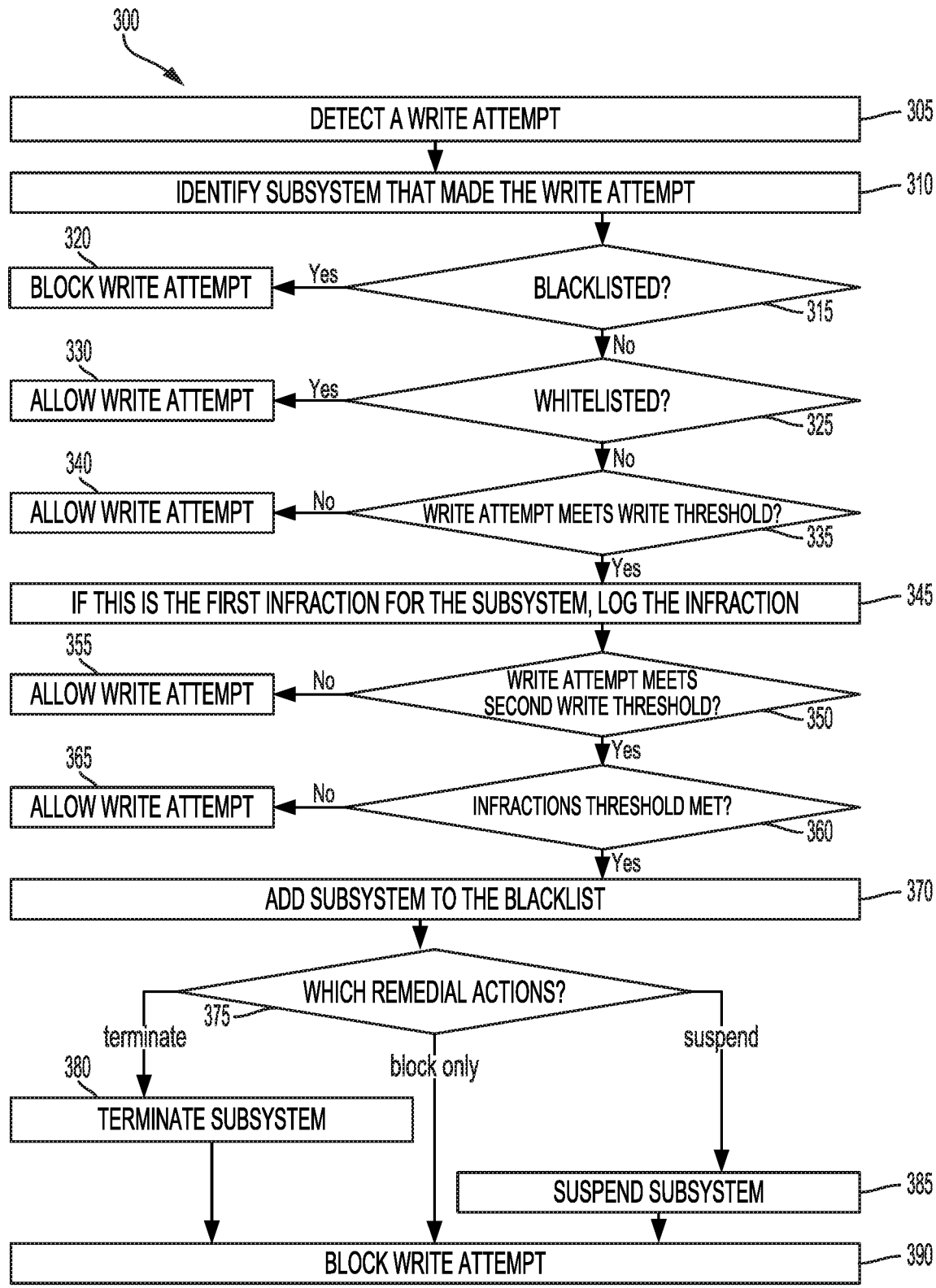
FIG. 3 is a flow diagram of a method for managing writes to a storage device to protect the lifespan of the storage device, according to certain implementations of the invention.

FIG. 3 is a flow diagram of a method 300 for managing writes to a storage device 110 to protect the lifespan of the storage device 110, according to certain implementations of the invention. This method 300 may be performed by a computing device 120. For instance, the method 300 may be implemented as program code integrated into the subsystem monitor 150, executable by the processing unit 130 on the computing device 120. In some implementations, an instance of this method 300 or similar may be performed each time is a write is attempted by a subsystem 170. Additionally or alternatively, although not shown in FIG. 3, the method 300 or similar may be performed periodically (e.g., every few seconds).

Prior to an initial execution of the method 300 (e.g., the first time the method 300 runs after a restart of the computing device 120), a respective write threshold may be established for each subsystem 170 installed on the computing device 120. For instance, the various write thresholds may be encoded in the storage 110 and accessible by a subsystem monitor 150. If the write thresholds are dynamic, the write thresholds may be updated as needed, and each future execution of the method 300 may use the updated write thresholds. In some embodiments, time is divided into intervals, such as a few seconds each, and a write threshold is applicable to each interval on an individual basis, such that a corresponding subsystem 170 risks remediation if the corresponding subsystem 170 meets the write threshold in a given interval.

In some implementations, the storage protection system 100 is run entirely in the memory 140, where the program code implementing the storage protection system 100 may be verified prior to execution of the method 300. In such implementations, the computing device 120 may load program code implementing this method 300 of managing writes into memory 140 prior to the initial execution of the method 300.

Further, prior to the initial execution of the method 300, the subsystem monitor 150 may establish a blacklist 180, which may be a list of subsystems 170 that have behaved badly in the past (e.g., by exceeding their respective write thresholds) and are thus subject to penalties. The blacklist 180 may be empty when the initial execution of the method 300 begins, but the blacklist 180 may be saved (e.g., in the memory 140) and utilized across various executions of the method 300. Each subsystem 170 on the blacklist 180 may be associated with at least one respective timer, such as a release timer or a remediation timer.

As shown in FIG. 3, at block 305 of the method 300, the subsystem monitor 150 detects a write attempt (i.e., an attempt to write to storage 110). For instance, a write to memory 140 may be deemed a write attempt, because the memory contents written are typically then synchronized to storage 110. Each attempt to write to a single block of memory may be deemed a write attempt, such that an attempt to write to multiple blocks of memory may be considered multiple write attempts, specifically, one write attempt per block.

At block 310, the subsystem monitor 150 identifies the subsystem 170 that performed the write attempt. The technique used to determine which subsystem 170 attempted the write may be based in part on how subsystems 170 are defined. For instance, if a subsystem 170 is defined to include a set of files, then the subsystem monitor 150 may identify the subsystem 170 that performed the write attempt based on the file being written. For another example, if a subsystem 170 is defined to include a set of processes, then the subsystem monitor 150 may identify the subsystem 170 that performed the write attempt based on the process performing the write attempt.

At block 310, the subsystem monitor 150 updates statistics describing write attempts of the subsystem 170 that performed the write attempt. For instance, in some implementations, the subsystem monitor 150 maintains a count of write attempts made by each subsystem 170 during an active interval (i.e., an interval that has started and has not yet ended). In some implementations, other statistics may be maintained, such as, for instance, the all-time total number of write attempts or write cycles (i.e., memory blocks actually synchronized to storage 110) for the subsystem 170, such as a rate of write attempts, or such as a comparison of write attempts in the active interval to prior intervals (i.e., intervals that occurred prior to the active interval). These statistics may be logged for use as described herein and, in some implementations, for debugging, reporting, or other purposes.

In some implementations, the computing device 120 communicates the statistics to a headend system, which is a centralized location for managing various computing devices 120. For instance, the headend system may aggregate the statistics received from various computing devices 120, and additionally or alternatively, the headend system may identify whether the computing device 120 is behaving in an anomalous manner based on the statistics as compared to the statistics of other computing devices 120 reporting to the headend system.

At decision block 315, the subsystem monitor 150 determines whether the subsystem 170 is on the blacklist 180. If the subsystem 170 is on the blacklist 180 (i.e., if the subsystem 170 was previously placed on the blacklist 180 and has not yet been removed from the blacklist 180), then at block 320, the subsystem monitor 150 blocks the write attempt. In this case, the subsystem monitor 150 may block all write attempts of the subsystem 170 that occur during the active interval. More specifically, for example, to block the write attempt, the subsystem monitor 150 does not allow the kernel of the computing device 120 to synchronize to the storage 110 the memory contents that the subsystem 170 wrote during the write attempt. In some implementations, the subsystem monitor 150 notifies the subsystem 170 (e.g., notifies a process in the subsystem 170) that the write attempt has been blocked. In that case, the method 300 then ends and may restart upon the next write attempt by a subsystem 170.

If the subsystem 170 is not on the blacklist 180, then at decision block 325, the subsystem monitor 150 determines whether the subsystem 170 is on the whitelist 190. If the subsystem is on the whitelist 190, then at block 330, the subsystem monitor 150 allows the subsystem 170 to write to the storage 110. Specifically, in one implementation, the subsystem monitor 150 does not interfere with the writing process, thus allowing the kernel to synchronize to storage 110 the memory contents written by the subsystem 170. In another implementation, the subsystem monitor 150 requests that the kernel synchronize the memory contents written by the subsystem 170 in the write attempt. The method 300 then ends and may restart upon the next write attempt by a subsystem 170.

If the subsystem 170 is on neither the blacklist 180 nor the whitelist 190, then the method 300 proceeds to decision block 335. At decision block 335, the subsystem monitor 150 determines whether the write attempt, if completed (e.g., if synchronized to the storage 110), would cause the subsystem 170 to meet (e.g., equal or exceed) its write threshold for the active interval. If the write attempt would not cause the subsystem 170 to meet its write threshold, then the method 300 proceeds to block 340, where the subsystem monitor 150 allows the subsystem 170 to complete the write attempt to storage 110. The method 300 then ends and may restart upon the next write attempt by a subsystem 170.

However, if the subsystem 170 is on neither the blacklist 180 nor the whitelist 190 and the write attempts would cause the subsystem 170 to meet its write threshold for the active interval, then the method 300 proceeds to block 345. At block 345, if this is the first time the subsystem 170 has met its write threshold since initialization (e.g., since the computing device 120 last restarted), then the subsystem monitor 150 may log this as the first time the subsystem 170 has met its write threshold. The resulting log may be used for debugging, reporting, or other purposes. In some implementations, the log may be transmitted to a centralized location, such as a headend system, for further use.

Although not shown in FIG. 3, in some implementations, if this is the subsystem's first time meeting its write threshold, the infraction may be forgiven. In that case, the subsystem monitor 150 may allow the write attempt, thus causing the memory contents written by the subsystem 170 to be synchronized to the storage 110. In the example method 300 of FIG. 3, however, the determination of whether this is the subsystem's first time meeting its write threshold is used for logging purposes only, and the write attempt may still be blocked as described below.

In some implementations, regardless of whether the subsystem 170 has met its write threshold in the past, at decision block 350, the subsystem monitor 150 determines whether the write attempt, if completed, would cause the subsystem 170 to meet a second write threshold for the active interval. Like the write threshold, the second write threshold may be associated with the subsystem 170 and thus may vary from one subsystem 170 to another. The second write threshold may be higher than the write threshold for the subsystem 170 and, more specifically, may be based on the write threshold. For instance, the second write threshold may be a percentage of the write threshold where that percentage is greater than a hundred percent. In one example, the second write threshold is 125% of the write threshold. Additionally or alternatively, the second write threshold is applicable to an extended interval that includes the active interval but is longer. For example, if the write threshold applies to intervals with lengths of one hour, the second write threshold may apply to extended intervals of one day. In this case, the second write threshold may be used to allow an occasional burst of excess writes as long as writes remain limited over a longer term.

If the write attempt would not cause the subsystem 170 to meet its second write threshold over an applicable term (e.g., the active interval or an active extended interval), then at block 355, the subsystem monitor 150 allows the write attempt to proceed, and thus, the memory contents written by the subsystem 170 in the write attempt may be synchronized to storage 110. However, if the write attempt would cause the subsystem 170 to meet its second write threshold over the applicable term, then the method 300 proceeds to decision block 360.

Some implementations utilize a second write threshold, as described above, to allow subsystems 170 to exceed their write thresholds to a small degree, without risk of being blacklisted or having write attempts blocked. However, it will be understood that other implementations need not utilize this second threshold. In that case, decision block 350 may be skipped, and the method may proceed from block 345 to decision block 360.

More generally, the storage protection system 100 may utilize a set of blocking criteria to determine whether to blacklist the subsystem 170, to block a subsystem 170 from writing to the storage 110, or both. In one implementation, the blocking criteria are met if and only if a subsystem 170 meets its write threshold, and responsive to the blocking criteria being met, the subsystem monitor 150 blacklists the subsystem 170 and blocks write attempt. In another implementation, the blocking criteria are met if and only if the subsystem 170 meets its second write threshold, and responsive to the blocking criteria being met, the subsystem monitor 150 blacklists the subsystem 170 and blocks the write attempt. In still another implementation, the blocking criteria are met only if and only if the subsystem 170 meets its write threshold a predetermined number of times within a timeframe (e.g., per week or since the last time the computing device 120 restarted) or meets its second write threshold a predetermined number of times within a timeframe, and responsive to such blocking criteria being met, the subsystem monitor blacklists the subsystem 170 and blocks the write attempt.

At decision block 360, the subsystem monitor 150 determines whether an infractions threshold has been met by the current infraction (i.e., by the write attempt causing the subsystem 170 to exceed the write threshold). In some implementations, the infractions threshold is or represents the number of infractions allowed by a subsystem 170 not on the blacklist 180 before the subsystem 170 is added to the blacklist 180. The infractions threshold may apply to an established timeframe, such as over the last day, over the last week, over a set number of intervals, or since the last restart of the computing device 120. In that case, the subsystem monitor 150 determines whether the subsystem 170 has met the infractions threshold within that timeframe. If it is determined at decision block 360 that the infractions threshold has not been met (e.g., equaled or exceeded), then the subsystem monitor 150 allows the write attempt at block 365. Otherwise, if the subsystem 170 has met the infractions threshold, the method 300 proceeds to block 370.

In some implementations, an infractions threshold is not used. The lack of an infractions threshold may be logically equivalent to the use of a value of 1 as the infractions threshold. In that case, decision block 360 may be skipped and the method 300 may proceed from decision block 350 to block 370.

At block 370, the subsystem monitor 150 adds the subsystem 170 to the blacklist 180 and initializes each timer associated with the subsystem 170. As described above, such timers may include one or both of a release timer and a remediation timer.

At decision block 375, the subsystem monitor 150 determines one or more remedial actions, in addition to blocking the write attempts, for handling the infraction of the subsystem 170. This determination may be based on previously established settings associated with the subsystem 170 in the storage protection system 100. For instance, the settings may indicate that the subsystem 170 should be suspended (i.e., paused), the subsystem 170 should be terminated (i.e., its various processes shut down), or some other remedial action should be taken when the subsystem 170 is blacklisted. In some implementations, each subsystem 170 may be associated with a set of remedial actions, which may be an empty set or may include one or more remedial actions triggered when the subsystem 170 is added to the blacklist 180. To determine which remedial action to perform, the subsystem monitor 150 may check the settings of the storage protection system 100 to determine which remedial actions are associated with the subsystem 170. In some implementations, the subsystem monitor 150 performs each remedial action indicated in the settings. If no such remedial actions are associated with the subsystem 170, other than simply blocking write attempts, then the method 300 may skip ahead to block 390.

In the example of FIG. 3, only two remedial actions are available other than blocking write attempts: suspending the subsystem 170 and terminating the subsystem 170. If the subsystem monitor 150 decides to terminate the subsystem 170, then at block 380, the subsystem monitor 150 terminates the subsystem 170. More specifically, if the subsystem 170 includes multiple processes, then some implementations of the subsystem monitor 150 may kill only the process that made the write attempt, while other implementations may kill multiple or all processes in the subsystem 170. It may be beneficial to kill all the processes of the subsystem 170 because such processes may be reliant on one another. The method 300 may then skip ahead to block 390. However, if the subsystem monitor 150 decides to suspend the subsystem 170, then at block 385, the subsystem monitor 150 suspends the subsystem 170. More specifically, if the subsystem 170 includes multiple processes, then some implementations suspend only the process that made the write attempt, while other implementations may suspend multiple or all processes in the subsystem 170. It may be beneficial to suspend all the processes of the subsystem 170 because such processes may be reliant on one another. In the case of suspending the subsystem 170, the subsystem 170 may be associated with a remediation timer, which counts a remediation time, at the expiration of which the subsystem 170 will be resumed. The method 300 may then proceed to block 390.

At block 390, the subsystem monitor 150 blocks the write attempt. In other words, the subsystem monitor 150 may block the memory contents written by the subsystem 170 during the active interval from being synchronized to storage 110. For instance, the subsystem monitor 150 may request that the kernel not synchronize the memory contents, or in an implementation in which the kernel only performs this synchronization upon request, the subsystem monitor 150 may simply opt not to request that the kernel synchronize the memory contents. In some implementations, the subsystem monitor 150 may notify the subsystem 170 of any remedial actions taken (e.g., suspension, write attempts blocked). The method 300 then ends and may restart upon the next write attempt by a subsystem 170.

Figure 4:
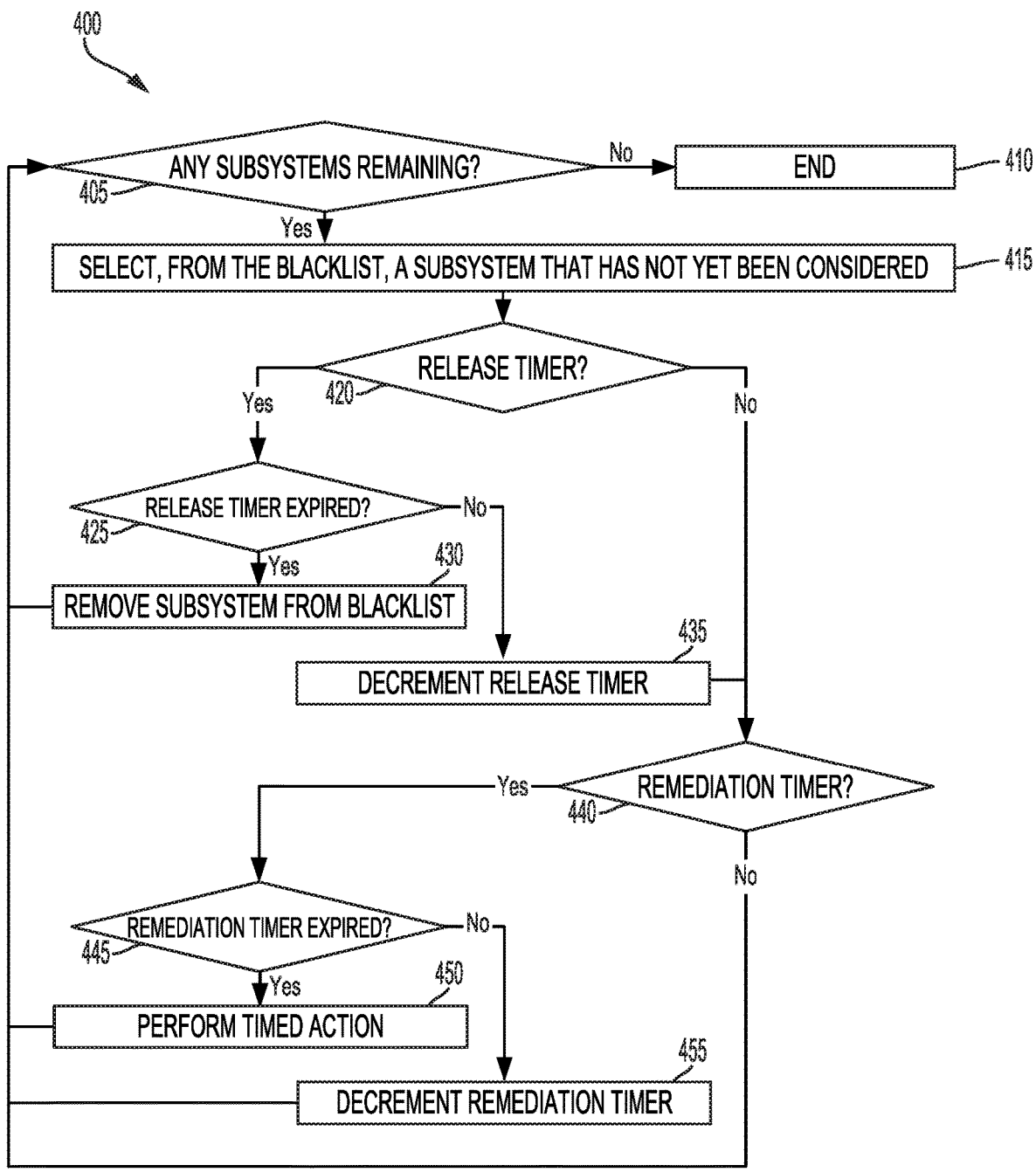
FIG. 4 is a flow diagram of a method for managing a blacklist of subsystems that have committed infractions, so as to protect the lifespan of a storage device, according to certain implementations of the invention.

FIG. 4 is a flow diagram of a method 400 for managing a blacklist 180 of subsystems 170 that have committed infractions, so as to protect the lifespan of a storage device 110, according to certain implementations of the invention. As described above, subsystems 170 may be added to the blacklist 180, such as for meeting (e.g., equaling or exceeding) their respective write thresholds. The method 400 of FIG. 4 or similar may be used to manage that blacklist 180, including, for instance, removing subsystems 170 from the blacklist 180 when certain conditions are met. In some implementations, a method 400 of managing the blacklist 180, as shown in FIG. 4, may run in parallel with a method 300 for managing writes, as shown in FIG. 3. For instance in some implementations, the method 400 of FIG. 4 or similar may run once per second or on some other periodic schedule to manage the blacklist 180 being populated by the method 300 of managing writes, while the method 300 of managing writes may run as write attempts occur.

The method 400 of FIG. 4 may iterate over the subsystems 170 on the blacklist 180. As shown in FIG. 4, at decision block 405, the blacklist manager 160 determines whether any more subsystems 170 on the blacklist 180 remain to be considered in the current execution of the method 400. If no subsystems 170 remain to be considered, then the method 400 may end at block 410. There may be no subsystems 170 left consider, for instance, if the blacklist 180 is empty or if one or more iterations have already been performed such that all subsystems 170 in the blacklist 180 have already been considered.

However, if one or more subsystems 170 remain to be considered, then at block 415, the blacklist manager 160 may select a subsystem 170 to consider in this iteration.

As described above, each subsystem 170 may be associated with at least one timer, which may include a release timer, a remediation timer, or both. At decision block 420, it may be determined whether the subsystem 170 selected has a release timer. If the subsystem 170 has a release timer, then the method 400 proceeds to decision block 425; otherwise, if the subsystem 170 does not have a release timer, the method 400 skips ahead to decision block 440.

If the subsystem 170 has a release timer, then at decision block 425, the blacklist manager 160 determines whether the release timer has expired. In some implementations, the release timer has been reset each time the subsystem 170 committed an infraction, and thus, the release timer has expired only after an associated release time has passed since the last infraction.

If the release timer has expired, then at block 430, the blacklist manager 160 removes the subsystem 170 from the blacklist 180, and the method 400 returns to block 405 to determine whether any more subsystems 170 remain for consideration in the present execution of the method 400.

However, if the release timer has not expired, then at block 435, the blacklist manager 160 decrements the release timer by the time passed between the current execution of the method 400 and the last execution of the method 400. For instance, if the release timer maintains time in seconds and the method 400 is executed once per second, then the release timer may be decremented by one to represent the time passed. The method 400 then proceeds to decision block 440 to consider a remediation timer, if applicable.

At decision block 440, the blacklist manager 160 determines whether the subsystem 170 is associated with a remediation timer. If the subsystem 170 is not associated with a remediation timer, then the method may return to block 405 to determine whether any additional subsystems 170 remain for consideration. However, if the subsystem 170 is associated with a remediation timer, then at decision block 445, the blacklist manager 160 determines whether the remediation timer has expired.

If the remediation timer has not expired, then at block 455, the blacklist manager 160 may decrement the remediation timer by the time passed between the current execution of the method 400 and the last execution of the method 400. The method 400 may then return to block 405 to determine whether any subsystems 170 remain for consideration.

However, if the remediation timer has expired, then at block 450, the blacklist manager 160 executes a timed action associated with the remediation timer. For instance, if the timed action is a return from suspension, then the blacklist manager 160 may resume the processes of the subsystem 170 that have been suspended. If the timed action is a restart of the subsystem 170 after having been terminated, then the blacklist manager 160 may restart the processes of the subsystem 170 that were terminated. In the case of a resume or restart of the subsystem 170, the blacklist manager 160 may also remove the subsystem 170 from the blacklist 180 or, if the subsystem 170 is associated with a release timer, may reset the release timer to allow the subsystem 170 an opportunity to be removed from the blacklist 180. If the timed action is a restart of the computing device 120 as a whole, then the blacklist manager 160 may initiate that restart of the computing device 120.

In some implementations, restarting the computing device 120 clears the blacklist 180. For instance, the storage protection system 100 may run in the memory 140, which may be volatile, and thus, a restart of the computing device 120 may clear the memory 140 and thus the blacklist 180. Alternatively, if the blacklist 180 is stored in the storage 110, the blacklist manager 160 may clear the blacklist 180 prior to restarting the computing device 120 in some implementations.

The method 400 then returns to block 405 to determine whether any more subsystems 170 remain for consideration.

Thus, implementations described herein protect a storage device 110 by restricting write cycles on the storage device 110 per subsystem 170. By managing writes of the various subsystems 170 on an individual basis, the storage protection system 100 may identify subsystems 170 performing too many writes and may limit the writes performed by such subsystems. Targeting subsystems 170 individually can, in some cases, enable the remainder of the computing device 120 to continue executing as usual while a lifespan of the storage device 110 is preserved over time.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for restricting write cycles to a storage device, the method comprising:
    tracking a first count of a first set of writes, to first memory contents, executed by a first subsystem of a computing device;
    determining that the first count meets a write threshold of the first subsystem;
    determining that blocking criteria are met by the first subsystem based on the first count meeting the write threshold of the first subsystem;
    determining that blocking criteria are not met by a second subsystem of the computing device; and
    selectively synchronizing to the storage device second memory contents written by the second subsystem while preventing synchronization to the storage device of the first memory contents written by the first subsystem, based on the blocking criteria not being met by the second subsystem and being met by the first subsystem.

2. The method of claim 1, wherein determining that the blocking criteria are met for the first subsystem further comprises determining that the first subsystem has exceeded the write threshold in the past.

3. The method of claim 1, wherein determining that the blocking criteria are met for the first subsystem further comprises determining that the first count meets a second write threshold higher than the write threshold.

4. The method of claim 1, further comprising:
    changing a status of the first subsystem to blacklisted based on the first count meeting the write threshold; and
    blocking additional writes executed by the first subsystem from being synchronized to the storage device while the first subsystem has the status of blacklisted.

5. The method of claim 4, further comprising:
    initializing a release timer associated with the first subsystem, based on the first subsystem having the status of blacklisted; and
    changing the status of the first subsystem from blacklisted responsive to expiration of the release timer.

6. The method of claim 4, further comprising:
    initializing a remediation timer associated with the first subsystem, based on the first subsystem having the status of blacklisted; and
    performing at least a portion of a remedial action responsive to expiration of the remediation timer.

7. The method of claim 6, wherein performing at least the portion of the remedial action responsive to the expiration of the remediation timer comprises at least one of (i) restarting the computing device responsive to the expiration of the remediation timer or (ii) terminating the first subsystem responsive to the expiration of the remediation timer.

8. The method of claim 6, further comprising:
    suspending the first subsystem based on the first subsystem having the status of blacklisted,
    wherein performing at least the portion of the remedial action responsive to the expiration of the remediation timer comprises resuming the first subsystem responsive to the expiration of the remediation timer.

9. The method of claim 1, wherein determining that the blocking criteria are not met for the second subsystem comprises determining that the second subsystem is on a whitelist.

10. The method of claim 1, wherein the first subsystem is defined as a set of one or more processes or files.

11. The method of claim 1, wherein:
    the first subsystem is a first software application;
    the second subsystem is a second software application; and
    selectively synchronizing the second memory contents written by the second subsystem to the storage device while preventing synchronization of the first memory contents written by the first subsystem, based on the blocking criteria not being met by the second subsystem and being met by the first subsystem, comprises:
        synchronizing the second memory contents written by the second software application to the storage device while preventing synchronization of the first memory contents written by the first software application, based on the blocking criteria not being met by the second software application and being met by the first software application.

12. The method of claim 1, further comprising:
    detecting installation of a new subsystem; and
    reducing the write threshold of the first subsystem based on installation of the new subsystem.

13. A computer-program product for restricting write cycles to a storage device, the computer-program product comprising a non-transitory computer-readable storage medium having program instructions embodied thereon, the program instructions executable by a processor to cause the processor to perform a method comprising:
    tracking a first count of a first set of writes, to first memory contents, executed by a first subsystem of a computing device;
    determining that the first count meets a write threshold of the first subsystem;
    determining that blocking criteria are met by the first subsystem based on the first count meeting the write threshold of the first subsystem;
    determining that blocking criteria are not met by a second subsystem of the computing device; and
    selectively synchronizing to the storage device second memory contents written by the second subsystem while preventing synchronization to the storage device of the first memory contents written by the first subsystem, based on the blocking criteria not being met by the second subsystem and being met by the first subsystem.

14. The computer-program product of claim 13, the method further comprising:
changing a status of the first subsystem to blacklisted based on the first count meeting the write threshold; and
blocking additional writes executed by the first subsystem from being synchronized to the storage device while the first subsystem has the status of blacklisted.

15. The computer-program product of claim 14, the method further comprising:
initializing a release timer associated with the first subsystem, based on the first subsystem having the status of blacklisted; and
changing the status of the first subsystem from blacklisted responsive to expiration of the release timer.

16. The computer-program product of claim 14, the method further comprising:
initializing a remediation timer associated with the first subsystem, based on the first subsystem having the status of blacklisted; and
performing at least a portion of a remedial action responsive to expiration of the remediation timer.

17. A computing device for restricting write cycles to a storage device, the computing device comprising:
a processor configured to execute computer-readable instructions;
a memory configured to store the computer-readable instructions that, when executed by the processor, cause the processor to perform operations comprising:
tracking a first count of a first set of writes, to first memory contents, executed by a first subsystem of a computing device;
determining that the first count meets a write threshold of the first subsystem;
determining that blocking criteria are met by the first subsystem based on the first count meeting the write threshold of the first subsystem;
determining that blocking criteria are not met by a second subsystem of the computing device; and
selectively synchronizing to the storage device second memory contents written by the second subsystem while preventing synchronization to the storage device of the first memory contents written by the first subsystem, based on the blocking criteria not being met by the second subsystem and being met by the first subsystem.

18. The computing device of claim 17, the operations further comprising:
changing a status of the first subsystem to blacklisted based on the first count meeting the write threshold; and
blocking additional writes executed by the first subsystem from being synchronized to the storage device while the first subsystem has the status of blacklisted.

19. The computing device of claim 18, the operations further comprising:
initializing a release timer associated with the first subsystem, based on the first subsystem having the status of blacklisted; and
changing the status of the first subsystem from blacklisted responsive to expiration of the release timer.

20. The computing device of claim 18, the operations further comprising:
initializing a remediation timer associated with the first subsystem, based on the first subsystem having the status of blacklisted; and
performing at least a portion of a remedial action responsive to expiration of the remediation timer.

* * * * *